United States Patent [19]

Kawasaki

[11] Patent Number: 5,796,213
[45] Date of Patent: Aug. 18, 1998

[54] INVERTER POWER SOURCE APPARATUS USING A PIEZOELECTRIC TRANSFORMER

[75] Inventor: Osamu Kawasaki, Tsuzuki-gun, Japan

[73] Assignee: Matsushita Electric Industrial Co., Ltd., Osaka, Japan

[21] Appl. No.: 706,906

[22] Filed: Sep. 3, 1996

[30] Foreign Application Priority Data

Aug. 31, 1995 [JP] Japan ................................ 7-223285

[51] Int. Cl.⁶ ............................................. H05B 37/02
[52] U.S. Cl. ..................... 315/209 R; 315/224; 315/307; 315/209 PZ; 310/316; 310/318
[58] Field of Search ............................ 315/219, 224, 315/307, 209 R, 209 PZ, 98, DIG. 7; 310/316, 318, 359, 321

[56] References Cited

U.S. PATENT DOCUMENTS

| | | | |
|---|---|---|---|
| 3,598,909 | 8/1971 | Sasaki et al. .................. | 178/7.3 R |
| 3,889,166 | 6/1975 | Scurlock ........................ | 318/116 |
| 4,584,499 | 4/1986 | Leskovec et al. . | |
| 4,595,864 | 6/1986 | Stiefelmeyer et al. ............ | 315/246 |
| 5,298,836 | 3/1994 | Backmund et al. .............. | 315/219 |
| 5,329,200 | 7/1994 | Zaitsu ............................ | 310/316 |
| 5,548,189 | 8/1996 | Williams ........................ | 315/224 |

FOREIGN PATENT DOCUMENTS

| | | |
|---|---|---|
| 0374617 | 6/1990 | European Pat. Off. . |
| 0529551 | 3/1993 | European Pat. Off. . |

OTHER PUBLICATIONS

*Patent Abstracts of Japan*, vol. 016, No. 240 (E-1211), 3 Jun. 1992 & JP 04 049846 A (NEC Corp.), 19 Feb. 1992.
*Patent Abstracts of Japan*, vol. 017, No. 668 (E-1473), 9 Dec. 1993 & JP 05 219730 A (Toshiba Corp.), 27 Aug. 1993.
*Patent Abstracts of Japan*, vol. 000, No. 00000 & JP 08 149850 A (Tokin Corp.), 7 Jun. 1996.

Primary Examiner—Robert Pascal
Assistant Examiner—Haissa Philogene
Attorney, Agent, or Firm—Beveridge, DeGrandi, Weilacher & Young, LLP

[57] ABSTRACT

An inverter power source apparatus using a piezoelectric transformer, has: variable oscillating device for oscillating a pulse signal; pulse-width changing device for changing a width of said pulse signal of said variable oscillating device; driving device for generating a driving signal on the basis of an output of said pulse-width changing device; a piezoelectric transformer which is driven by said driving signal, drives a predetermined load, and has input and output electrodes; detecting device for detecting a relationship between said driving signal and a resonance frequency of said piezoelectric transformer, and for, on the basis of a result of the detection, controlling a frequency of said oscillation signal of said variable oscillating device so that a difference between said resonance frequency and a frequency of said driving signal is substantially within a preset range; and pulse-width controlling device for, when a detection results of said detecting device shows that said difference between said resonance frequency and said frequency of said driving signal is substantially within said preset range, controlling said pulse-width changing device so that a current flowing through said load is substantially constant.

12 Claims, 11 Drawing Sheets

INVERTER POWER SOURCE APPARATUS USING A PIEZOELECTRIC TRANSFORMER

BACKGROUND OF THE INVENTION

1. Field of the Invention

The invention relates to an inverter power source apparatus using a piezoelectric transformer which transforms the amplitude of an AC voltage by the piezoelectric effect of a piezoelectric element such as a piezoelectric ceramics.

2. Related Art of the Invention

A piezoelectric transformer developed at the end of the nineteen fifties was further developed because it received attention as a step-up transformer for a high voltage power source. However, material restrictions such as a breaking strength of a piezoelectric ceramic material prevented a piezoelectric transformer from being greatly commercially introduced, and its development was suspended. In recent years, development of a high-strength piezoelectric ceramic progresses, and portable information devices such as notebook personal computers, electronic organizers, and game machines are significantly required to be smaller and thinner. With such development and requirements, great attention is again directed toward a piezoelectric transformer as a step-up transformer in an inverter power source for a liquid crystal back light which is mounted on such a device.

An inverter for a liquid crystal back light is used as a power source for a cold cathode fluorescent lamp which is used as a source for a back light. The inverter requires transformation of a low DC voltage such as 5 V, 9 V, or 12 V supplied from a battery to a high-frequency voltage of a high voltage of about 1,000 Vrms at a start of the lighting and of about 500 Vrms in a steady state. An electromagnetic wound-type transformer which is currently used in an inverter for a back light utilizes a horizontal structure having a special core so as to comply with the trend towards to a thinner body. In order to ensure a withstand voltage, however, there is a limit for realizing a smaller and thinner transformer. In addition, because the core loss is large and the use of a thin copper wire causes the winding loss to be increased, the efficiency is disadvantageously low.

On the other hand, a piezoelectric transformer has the following configuration. Primary (input side) and secondary (output side) electrodes are disposed on a piezoelectric ceramic material such as lead zirconate titanate (PZT) or a piezoelectric crystal material such as lithium niobate. An AC voltage of a frequency which is in the vicinity of the resonance frequency of the piezoelectric transformer is applied to the primary electrode so that the piezoelectric transformer is caused to mechanically resonate. The mechanical oscillation is transformed by the piezoelectric effect so as to be taken out from the secondary electrode on the secondary side in the form of a high voltage. Such a piezoelectric transformer has features that it can realize a smaller body, and especially a thinner body as compared with an electromagnetic transformer, and can attain a high conversion efficiency. Unlike an electromagnetic wound-type transformer, a piezoelectric transformer is prevented from being caused by overload to burn, and hence has higher reliability.

Hereinafter, a prior art inverter power source apparatus using a piezoelectric transformer will be described with reference to the relevant drawings.

FIG. 9 is a view schematically showing a Rosen-type piezoelectric transformer. The piezoelectric transformer is constructed in such a manner that electrodes on the primary side (input side) and the secondary side (output side) are disposed on a rectangular plate made of a piezoelectric ceramic material such as lead zirconate titanate (PZT). As indicated by P in the figure, the primary electrode portion is polarized in the thickness direction of the rectangular plate, and the secondary electrode portion is polarized in the longitudinal direction of the rectangular plate. When an AC voltage of a frequency in the vicinity of the resonance frequency of the piezoelectric transformer is applied to the primary electrodes, the piezoelectric transformer is caused to mechanically oscillate in the longitudinal direction. The mechanical oscillation is transformed into a voltage by the piezoelectric effect, so as to be outpitted as a high-voltage power from the secondary electrodes.

Conventional systems for driving a piezoelectric transformer include a self-excited oscillation circuit system in which a piezoelectric transformer is connected in a loop of an oscillation circuit, and a separately excited oscillation circuit system in which an oscillation circuit is separately disposed. The self-excited oscillation circuit system has a problem in conversion efficiency, and contains drawbacks such as that the system cannot follow a large fluctuation of loads. Because of these reasons, in recent prior art examples, the separately excited oscillation circuit system is often used.

FIG. 10 is a block diagram of a prior art driving circuit of separately excited oscillation circuit type for the Rozen-type piezoelectric transformer shown in FIG. 9, i.e., a prior art inverter power source apparatus using a piezoelectric transformer. Referring to FIG. 10, an oscillation circuit 101 generates an AC driving signal in the vicinity of the resonance frequency of a piezoelectric transformer 104 and the output signal of the oscillation circuit 101 contains signals other than the driving frequency component. These signals are transformed into a loss or heat in the piezoelectric transformer 104. Therefore, the output signal of the variable oscillation circuit 101 is waveform-shaped into a substantially sinusoidal wave by a waveform shaping circuit 102 in order to reduce a loss in the piezoelectric transformer 104. As the waveform shaping circuit 102, a low pass filter which functions only to reduce high-frequency components is used in a simple case, and a bandpass filter which reduces low- and high-frequency components is used in the case where the efficiency is significant. The output of the waveform shaping circuit 102 is subjected in a driving circuit 103 to current amplification or voltage amplification so as to have a level at which the piezoelectric transformer can be sufficiently driven. The driving circuit 103 is configured by only a usual amplifying circuit consisting of transistors, or by a combination of an amplifying circuit and a step-up transformer. The output of the driving circuit 103 is boosted by the piezoelectric transformer 104, and then applied to, for example, a cold cathode fluorescent lamp 105 which functions as a load, so that the cold cathode fluorescent lamp 105 is lit.

The resonance frequency of the piezoelectric transformer 104 is varied because of changes in environments such as the temperature and the load. If the piezoelectric transformer 104 is driven by a constant frequency as in the circuit shown in FIG. 10, therefore, the relationship between the resonance frequency of the piezoelectric transformer and the driving frequency is varied. When the driving frequency is largely deviated from the resonance frequency of the piezoelectric transformer, the voltage step-up ratio of the piezoelectric transformer is significantly reduced so that a sufficient current cannot be caused to flow through the cold cathode fluorescent lamp 105. Thus, the cold cathode fluorescent lamp 105 cannot keep sufficient brightness.

A circuit shown in FIG. 11 can comply with the variation in the characteristics such as the resonance frequency or the like of the piezoelectric transformer 104. FIG. 11 is a block diagram of another prior art inverter power source apparatus for the piezoelectric transformer 104 shown in FIG. 9, i.e., a prior art inverter power source apparatus using a piezoelectric transformer. Functions of a variable oscillation circuit 101, a waveform shaping circuit 102, a driving circuit 103, and a piezoelectric transformer 104 are the same as those in the circuit shown in FIG. 10. However, a feedback resistor 106 having a small resistance is connected in series to the cold cathode fluorescent lamp 105 which is a load of the inverter power source apparatus, so that the current flowing through the cold cathode fluorescent lamp 105 is detected via the feedback resistor 106. The voltage across the feedback resistor 106 which is proportional to the current flowing through the cold cathode fluorescent lamp 105 is input to an oscillation control circuit 107. The oscillation control circuit 107 controls the frequency of the output signal of the variable oscillation circuit 101 in such a manner that the voltage across the feedback resistor 106 is constant, i.e., the current flowing through the cold cathode fluorescent lamp 105 is constant. As a result of the control, the cold cathode fluorescent lamp 105 is lit with substantially constant brightness. Further, 110 is a current detecting circuit.

A circuit shown in FIG. 12 can comply with the variation in the characteristics such as the resonance frequency or the like of the piezoelectric transformer 104. FIG. 12 is a block diagram of another prior art inverter power source apparatus for the piezoelectric transformer 104 shown in FIG. 9, i.e., a prior art inverter power source apparatus using a piezoelectric transformer. Functions of a variable oscillation circuit 101, a waveform shaping circuit 102, a driving circuit 103, and a piezoelectric transformer 104 are the same as those in the circuit shown in FIG. 10. However, a feedback resistor 106 having a small resistance is connected in series to the cold cathode fluorescent lamp 105 so that the current flowing through the cold cathode fluorescent lamp 105 is detected via the feedback resistor 106. When the characteristics such as the resonance frequency of the piezoelectric transformer 104 are varied because of changes in load, environment, or the like. The voltage across the feedback resistor 106 which is proportional to the current flowing through the cold cathode fluorescent lamp 105 is input to a pulse-width control circuit 108. The pulse- width control circuit 108 controls a pulse-width varying circuit 109 so as to change the pulse width of the output signal of the variable oscillation circuit 101 in such a manner that the voltage across the feedback resistor 106 is constant, i.e., the current flowing through the cold cathode fluorescent lamp 105 is constant. As a result of the control, the cold cathode fluorescent lamp 105 is lit with substantially constant brightness. Further, 110 is a current detecting circuit.

In the above, the driving circuit of the separately excited oscillation circuit system has been described as a prior art example of the inverter power source apparatus using a piezoelectric transformer. In the abovedescribed inverter power source apparatus using a piezoelectric transformer, the driving frequency of the piezoelectric transformer is controlled in order that the output current flowing through the load connected to the piezoelectric transformer is kept substantially constant. In other words, when the output current is to be increased, the driving frequency is brought close to the resonance frequency, and, when the output current is to be decreased, the driving frequency is made separate from the resonance frequency. In this system, when the power source voltage of the circuit is lowered, however, a current cannot be sufficiently supplied to the piezoelectric transformer even if the driving frequency is made coincident with the resonance frequency, and also the output current cannot be kept to a predetermined value. By contrast, when the power source voltage is raised, the driving frequency is largely separated from the resonance frequency of the piezoelectric transformer, with the result that the driving efficiency is significantly lowered. Also when the load of the piezoelectric transformer is greatly increased or decreased, similarly, the output current of the piezoelectric transformer cannot be kept to the predetermined value, or the driving frequency is largely separated from the resonance frequency, thereby producing a problem in that the driving efficiency is significantly lowered.

Methods are known in which, when the power source voltage is varied or when the load of the piezoelectric transformer is varied, the output voltage of a driving circuit is changed without changing the driving frequency. Among such methods, a method in which the pulse width is modulated is usually employed. In this case, when the pulse width is decreased (the duty is decreased), high-frequency components other than the fundamental driving frequency are increased. Such high-frequency components are transformed into a loss by the piezoelectric transformer so that heat generation is increased in the piezoelectric transformer, thereby producing problems in that the driving efficiency is lowered and reliability also is significantly impaired.

SUMMARY OF THE INVENTION

It is an object of the invention to provide an inverter power source apparatus using a piezoelectric transformer which, even when the power source voltage or the load of the piezoelectric transformer is largely changed, can sufficiently comply with such a large change, thereby satisfying all the conditions of high driving efficiency, high reliability, and a long life period.

An inverter power source apparatus using a piezoelectric transformer of the present invention comprises:

variable oscillating means for oscillating a pulse signal;

pulse-width changing means for changing a width of said pulse signal of said variable oscillating means;

driving means for generating a driving signal on the basis of an output of said pulse-width changing means;

a piezoelectric transformer which is driven by said driving signal, drives a predetermined load, and has input and output electrodes;

detecting means for detecting a relationship between said driving signal and a resonance frequency of said piezoelectric transformer, and for, on the basis of a result of the detection, controlling a frequency of said oscillation signal of said variable oscillating means so that a difference between said resonance frequency and a frequency of said driving signal is substantially within a preset range; and pulse-width controlling means for, when a detection results of said detecting means shows that said difference between said resonance frequency and said frequency of said driving signal is substantially within said preset range, controlling said pulse-width changing means so that a current flowing through said load is substantially constant.

An inverter power source apparatus using a piezoelectric transformer of the present invention comprises:

variable oscillating means for oscillating a pulse signal;

pulse-width changing means for changing a width of said pulse signal of said variable oscillating means;

driving means for amplifying a power of an output signal of said pulse-width changing means, thereby generating a driving signal;

a piezoelectric transformer which is driven by said driving signal, drives a predetermined load, and has input and output electrodes;

detecting means for detecting a relationship between said driving signal and a resonance frequency of said piezoelectric transformer, and for, on the basis of a result of the detection, controlling a frequency of said oscillation signal of said variable oscillating means so that a difference between said resonance frequency and a frequency of said driving signal is substantially within a preset range;

pulse-width controlling means for, when a detection results of said detecting means shows that said difference between said resonance frequency and said frequency of said driving signal is substantially within said preset range, controlling said pulse-width changing means so that a current flowing through said load is substantially constant; and a DC—DC converter which changes a voltage of a direct-current power source of said driving means on the basis of a pulse width in said pulse-width changing means or on the basis of a power source voltage.

An inverter power source apparatus using a piezoelectric transformer of the present invention comprises:

variable oscillating means for oscillating a pulse signal;

pulse-width changing means for changing a width of said pulse signal of said variable oscillating means;

driving means for amplifying a power of an output signal of said pulse-width changing means, thereby generating a driving signal;

a step-up transformer in which a step-up ratio of boosting said driving signal is changeable;

a piezoelectric transformer which is driven by an output of said step-up transformer, drives a predetermined load, and has input and output electrodes;

detecting means for detecting a relationship between said driving signal and a resonance frequency of said piezoelectric transformer, and for, on the basis of a result of the detection, controlling a frequency of said oscillation signal of said variable oscillating means so that a difference between said resonance frequency and a frequency of said driving signal is substantially within a preset range;

pulse-width controlling means for, when a detection results of said detecting means shows that said difference between said resonance frequency and said frequency of said driving signal is substantially within said preset range, controlling said pulse-width changing means so that a current flowing through said load is substantially constant; and step-up ratio changing means for changing said step-up ratio of said step-up transformer on the basis of a pulse width in said pulse-width changing means or on the basis of a power source voltage.

An inverter power source apparatus using a piezoelectric transformer of the present invention comprises:

variable oscillating means for oscillating a pulse signal;

pulse-width changing means for changing a width of said pulse signal of said variable oscillating means;

driving means for generating a driving signal on the basis of an output of said pulse-width changing means;

a piezoelectric transformer which is driven by said driving signal, drives a predetermined load, and has input and output electrodes;

detecting means for detecting a relationship between said driving signal and a resonance frequency of said piezoelectric transformer, and for, on the basis of a result of the detection, controlling a frequency of said oscillation signal of said variable oscillating means so that a difference between said resonance frequency and a frequency of said driving signal is substantially within a preset range; and pulse-width controlling means for, when a detection results of said detecting means shows that said difference between said resonance frequency and said frequency of said driving signal is substantially within said preset range, controlling said pulse-width changing means so that a current flowing through said load is substantially constant, said variable oscillating means bringing said frequency to said resonance frequency as close as possible, until the width of said pulse signal reaches a predetermined limit.

An inverter power source apparatus using a piezoelectric transformer of the present invention comprises:

variable oscillating means for oscillating a pulse signal;

pulse-width changing means for changing a width of said pulse signal of said variable oscillating means;

driving means for generating a driving signal on the basis of an output of said pulse-width changing means;

a piezoelectric transformer which is driven by said driving signal, drives a predetermined load, and has input and output electrodes;

detecting means for detecting a relationship between said driving signal and a resonance frequency of said piezoelectric transformer, and for, on the basis of a result of the detection, controlling a frequency of said oscillation signal of said variable oscillating means so that a difference between said resonance frequency and a frequency of said driving signal is substantially within a preset range; and pulse-width controlling means for, when a detection results of said detecting means shows that said difference between said resonance frequency and said frequency of said driving signal is substantially within said preset range, controlling said pulse-width changing means so that a current flowing through said load is substantially constant, said pulse-width controlling means bringing a duty ratio of a pulse to a predetermined value as close as possible, until said frequency reaches a limit value which is determined on the basis of said resonance frequency.

According to the invention, an inverter power source apparatus using a piezoelectric transformer can be provided in which the control range of the output current is widened by an operation of controlling the pulse width of a driving signal, so that, even when the load is largely changed, the apparatus can sufficiently comply with the change, and in which the driving efficiency is made high by setting the relationship between the resonance frequency of the piezoelectric transformer and the driving frequency substantially constant by the control of the driving frequency.

According to the invention, an inverter power source apparatus using a piezoelectric transformer can be provided in which the control range of the output current is widened by operations of controlling the pulse width of a driving signal and controlling a DC power source, so that, even when the load is largely changed, the apparatus can sufficiently comply with the change, and in which the driving efficiency is made high by setting the relationship between the resonance frequency of the piezoelectric transformer and the driving frequency substantially constant by the control of the driving frequency.

According to the invention, an inverter power source apparatus using a piezoelectric transformer can be provided in which the control range of the output current is widened by operations of controlling the pulse width of a driving signal and controlling the step-up ratio, so that, even when the load is largely changed, the apparatus can sufficiently comply with the change, and in which the driving efficiency is made high by setting the relationship between the resonance frequency of the piezoelectric transformer and the driving frequency substantially constant by the control of the driving frequency.

According to the fourth embodiment of the invention, an inverter power source apparatus using a piezoelectric transformer can be provided in which the control range of the output current is widened by a control of the driving frequency and an operation of controlling the pulse width of the driving signal, so that, even when the load is largely changed, the apparatus can sufficiently comply with the change, and in which the driving efficiency is made high by setting the relationship between the resonance frequency of the piezoelectric transformer and the driving frequency substantially constant.

Figure 1:
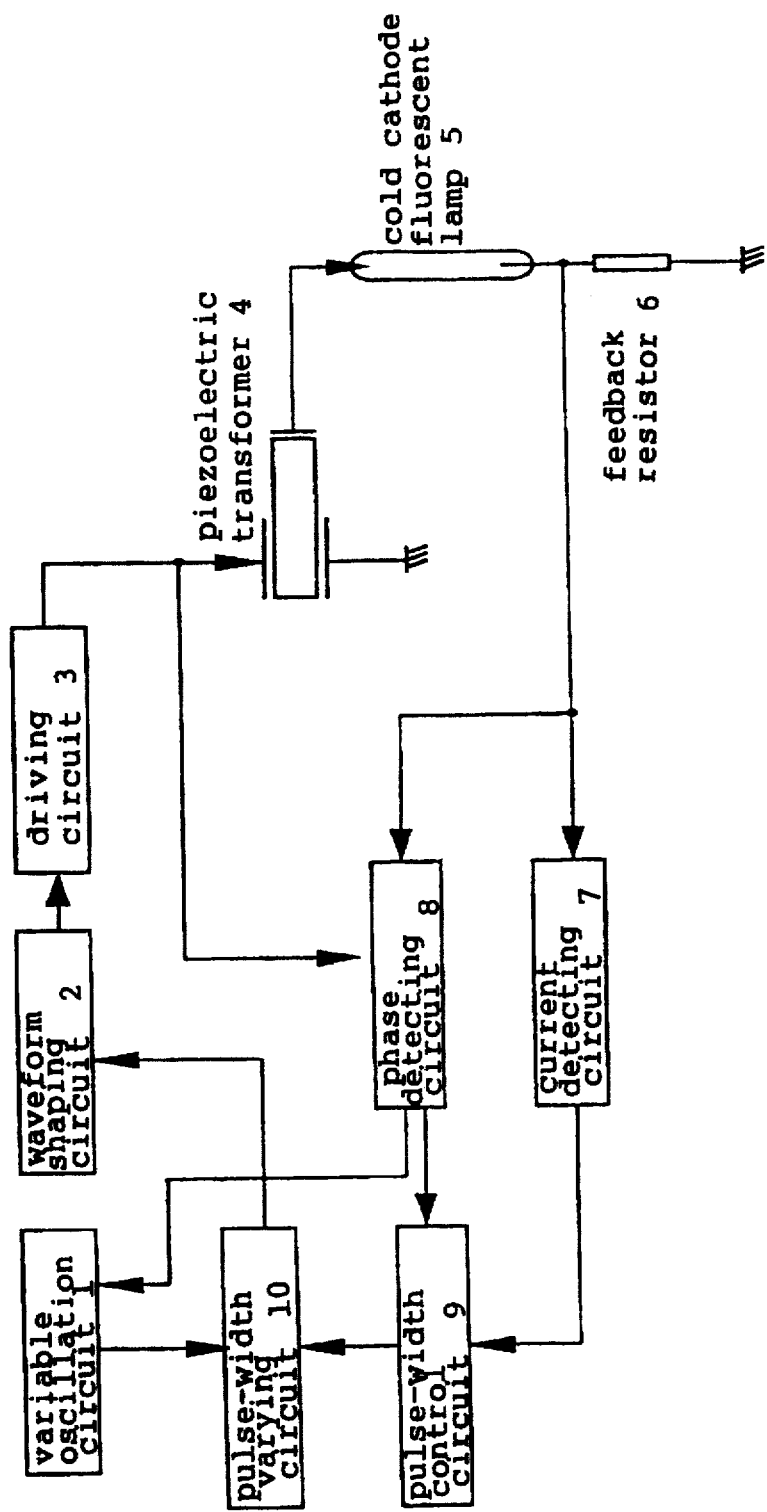
FIG. 1 is a block diagram of Embodiment 1 of the inverter power source apparatus using a piezoelectric transformer according to the invention.

LEGEND OF THE REFERENCE NUMERALS 1 variable oscillation circuit
2 waveform shaping circuit
3 driving circuit
4 piezoelectric transformer
5 cold cathode fluorescent lamp
6 feedback resistor
7 current detecting circuit
8 phase detecting circuit
9 pulse-width control circuit
10 pulse-width varying circuit
11 DC—DC converter
12 step-up ratio varying circuit
13 step-up transformer

DESCRIPTION OF THE PREFERRED EMBODIMENTS

Hereinafter, embodiments of the invention will be described in detail with reference to the drawings.
(Embodiment 1)

FIG. 1 is a block diagram showing an inverter power source apparatus using a piezoelectric transformer which is an embodiment of the invention. In the figure, the piezoelectric transformer 4 may be a piezoelectric transformer of any desired type, i.e., the Rosen type or another type. A variable oscillation circuit 1 generates an AC driving signal of a frequency which is in the vicinity of and higher than the resonance frequency of the piezoelectric transformer 4. The output of the variable oscillation circuit 1 is input to a pulse-width varying circuit 10 wherein the AC output signal of the variable oscillation circuit 1 is subjected to the pulse width modulation. When the piezoelectric transformer 4 is driven by a driving signal having a pulse waveform, high-frequency components other than those in the vicinity of the resonance frequency are transformed into heat in the piezoelectric transformer 4. In the view point of the reliability of the piezoelectric transformer 4 and the conversion efficiency, the high-frequency components of the output signal of the variable oscillation circuit 1 are removed away by a waveform shaping circuit 2 so that the output signal is shaped into a substantially sinusoidal wave. In a simple case, the waveform shaping circuit 2 is a low pass filter. In the case where the efficiency is especially significant, a bandpass filter is used as the waveform shaping circuit 2. The output of the waveform shaping circuit 2 is subjected by a driving circuit 3 to current amplification or voltage amplification so as to be amplified to a level sufficient for driving the piezoelectric transformer 4. The driving circuit 3 is configured by only a usual amplifying circuit consisting of transistors, or by a combination of an amplifying circuit and a step-up transformer. The output of the driving circuit 3 is input to the piezoelectric transformer 4. The piezoelectric transformer 4 boosts the input voltage by the piezoelectric effect. The output signal of the piezoelectric transformer is applied to a cold cathode fluorescent lamp 5 which is a load, so that the cold cathode fluorescent lamp 5 is lit.

The resonance frequency of the piezoelectric transformer 4 is varied by changes in environments such as the ambient temperature-and the load, or by a temperature rise due to the driving operation. If the piezoelectric transformer 4 is driven by a constant frequency, therefore, the relationship between the resonance frequency of the piezoelectric transformer 4 and the driving frequency is varied. If the driving frequency is largely deviated from the resonance frequency of the piezoelectric transformer 4, the voltage step-up ratio of the piezoelectric transformer 4 is critically reduced and a sufficient voltage cannot be applied to the load (in the embodiment, the cold cathode fluorescent lamp 5). As a result, a sufficient current cannot be caused to flow through the cold cathode fluorescent lamp 5, and the cold cathode fluorescent lamp 5 cannot keep sufficient brightness.

The circuit shown in FIG. 1 can comply with the variation in the characteristics such as the resonance frequency of the piezoelectric transformer 4. A feedback resistor 6 having a small resistance is connected in series to the cold cathode fluorescent lamp 5. The feedback resistor 6 is used for detecting the current flowing through the cold cathode fluorescent lamp 5. The voltage across the feedback resistor 6 is input to a current detecting circuit 7. The current detecting circuit 7 detects the load current flowing through the cold cathode fluorescent lamp 5, from the voltage across the feedback resistor 6, and supplies the results to a pulse-width control circuit 9. The pulse-width control circuit 9 controls the pulse width of the output signal of the variable oscillation circuit 1 via the pulse-width varying circuit 10 so that the voltage across the feedback resistor 6 is constant, i.e., the load current flowing through the cold cathode fluorescent lamp 5 is constant. When the current of the cold cathode fluorescent lamp 5 which is the load is decreased, for example, the voltage across the feedback resistor 6 is lowered. The pulse-width control circuit 9 detects that the voltage across the feedback resistor 6 becomes lower than a predetermined value, and gives the pulse-width varying circuit 10 instructions for increasing the pulse width of the driving signal. Consequently, the amplitude of the output signal of the waveform shaping circuit 2 is increased so that the input of the piezoelectric transformer 4 is increased, thereby increasing the current of the cold cathode fluorescent lamp 5. By contrast, when the current of the cold cathode fluorescent lamp 5 is increased, the voltage across the feedback resistor 6 is raised. The pulse-width control circuit 9 detects that the voltage across the feedback resistor 6 becomes higher than the predetermined value, and gives the pulse-width varying circuit 10 instructions for decreasing the pulse width of the driving signal. Consequently, the amplitude of the output signal of the waveform shaping circuit 2 is decreased so that the input of the piezoelectric transformer 4 is decreased, thereby reducing the current of the cold cathode fluorescent lamp 5. As a result of the control, the current of the cold cathode fluorescent lamp 5 becomes substantially constant and the cold cathode fluorescent lamp is lit with substantially constant brightness.

When only the control of changing the pulse width of the driving signal is conducted in order to make substantially constant the current of the cold cathode fluorescent lamp 5 which is the load, however, there is a possibility that the relationship between the driving frequency and the resonance frequency of the piezoelectric transformer is not substantially constant. When the driving frequency is largely deviated from the resonance frequency of the piezoelectric transformer 4, the driving efficiency of the piezoelectric transformer 4 is significantly lowered. In the case where only the control of changing the pulse width is conducted, moreover, there may be a case where, when the load is increased, a sufficient current cannot be supplied to the load. To comply with this, in the circuit of FIG. 1, the relationship between the resonance frequency of the piezoelectric transformer 4 and the driving frequency is limited by a phase detecting circuit 8. Furthermore, in addition to the pulse-width control, also the change of the driving frequency within a preset range is conducted.

Figure 2:
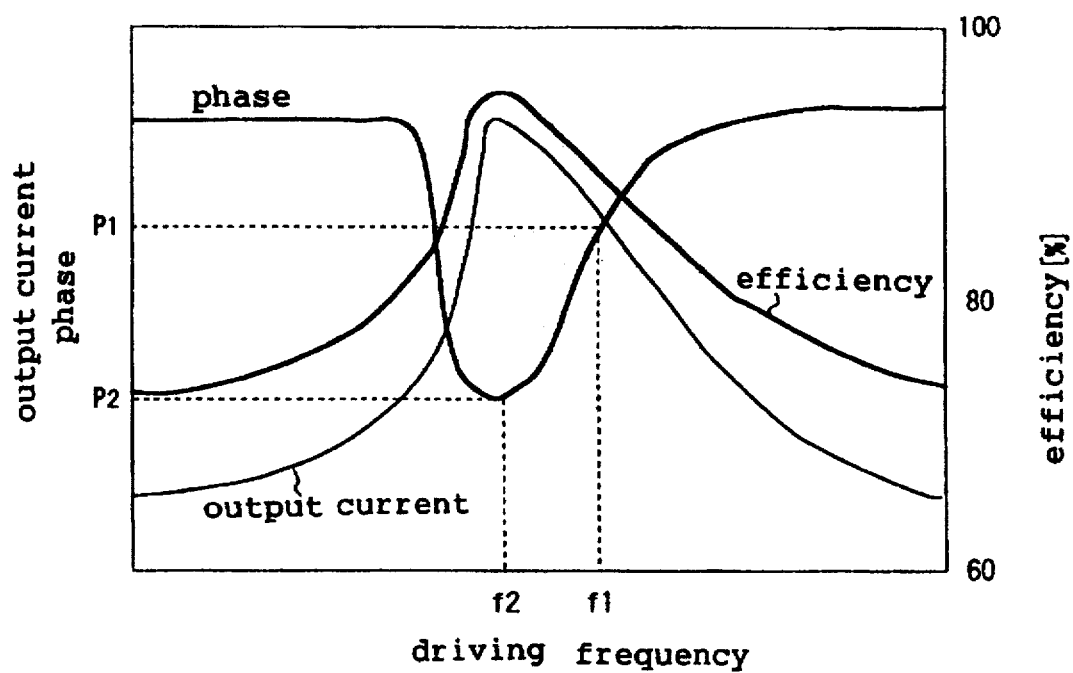
FIG. 2 is a frequency characteristic graph of an output load current, the phase difference between a voltage across a feedback resistor and an input voltage of a piezoelectric transformer, and the driving efficiency.

FIG. 2 shows frequency characteristics of the output current of the piezoelectric transformer 5 which flows into the load, the phase difference between the voltage across the feedback resistor 6 and the input voltage of the piezoelectric transformer 4, and the driving efficiency. The operations of limiting and changing the driving frequency in the circuit of FIG. 1 will be described with reference to the characteristic graph of FIG. 2. Before the fluorescent lamp is driven, a range $P_1-P_2$ of the phase difference is previously determined. When the circuit of FIG. 1 start to operate, the variable oscillation circuit 1 generates the AC driving signal of a frequency which is in the vicinity of and higher than the resonance frequency of the piezoelectric transformer 4. The phase detecting circuit 8 detects the phase difference P between the voltage across the feedback resistor 6 and the input voltage of the piezoelectric transformer 4, and sets the driving frequency via the variable oscillation circuit 1 so that the phase difference is always equal to or smaller than $P_1$. In an initial stage, the operation frequency is sufficiently higher than the resonance frequency, and hence the phase difference is not smaller than $P_1$ so that the driving frequency is lowered until the phase difference is lowered so as not to be larger than $P_1$ and to be within the preset range $P_1-P_2$. In order to inform whether the driving frequency is currently within the preset range or not, the detection results of the phase detecting circuit 8 are input also to the pulse-width control circuit 9.

When the phase difference is within the preset range $P_1-P_2$, the control of changing the pulse width of the driving signal is enabled. Specifically, when the phase difference is within the preset range $P_1-P_2$ and the output current is decreased, the pulse-width control circuit 9 gives the pulse-width varying circuit 10 instructions for increasing the pulse width of the driving signal, so that the amplitude of the output signal of the waveform shaping circuit 2 is increased. By contrast, when the load current is increased, the pulse-width control circuit 9 gives the pulse-width varying circuit 10 instructions for decreasing the pulse width of the driving signal, so that the amplitude of the output signal is decreased. When the phase difference is caused by any reason to be outside the preset range $P_1-P_2$ and equal to or larger than $P_1$, the operation of the pulse-width control circuit 9 is stopped and the driving frequency is changed via the variable oscillation circuit 1 so that the phase difference is always within the preset range $P_1-P_2$, with the result that the input of the piezoelectric transformer 4 is changed by the pulse-width varying circuit 10.

In the embodiment, the phase difference between the driving voltage of the piezoelectric transformer 4 and the current flowing into the cold cathode fluorescent lamp 5 which is the load is used in the detection of the resonance characteristics of the piezoelectric transformer 4. It is a matter of course that the same effects can be attained in a configuration in which the phase difference between the driving voltage of the cold cathode fluorescent lamp 5 which is the load and the current flowing into the cold cathode fluorescent lamp 5, that between the input and output voltages of the piezoelectric transformer 4, that between the input and output currents of the piezoelectric transformer 4, the frequency characteristics of the input or output current of the piezoelectric transformer 4, or the like is used.

An inverter power source apparatus using a piezoelectric transformer can be provided in which the control range of the output current is widened by the above-described operation of changing the pulse width of the driving signal while limiting the variable frequency range of the driving signal, so that, even when the load is changed, the apparatus can sufficiently comply with the change, and in which the driving efficiency is made high by setting the driving frequency within the preset range which is determined on the basis from the resonance characteristics of the piezoelectric transformer.

(Embodiment 2)

Figure 3:
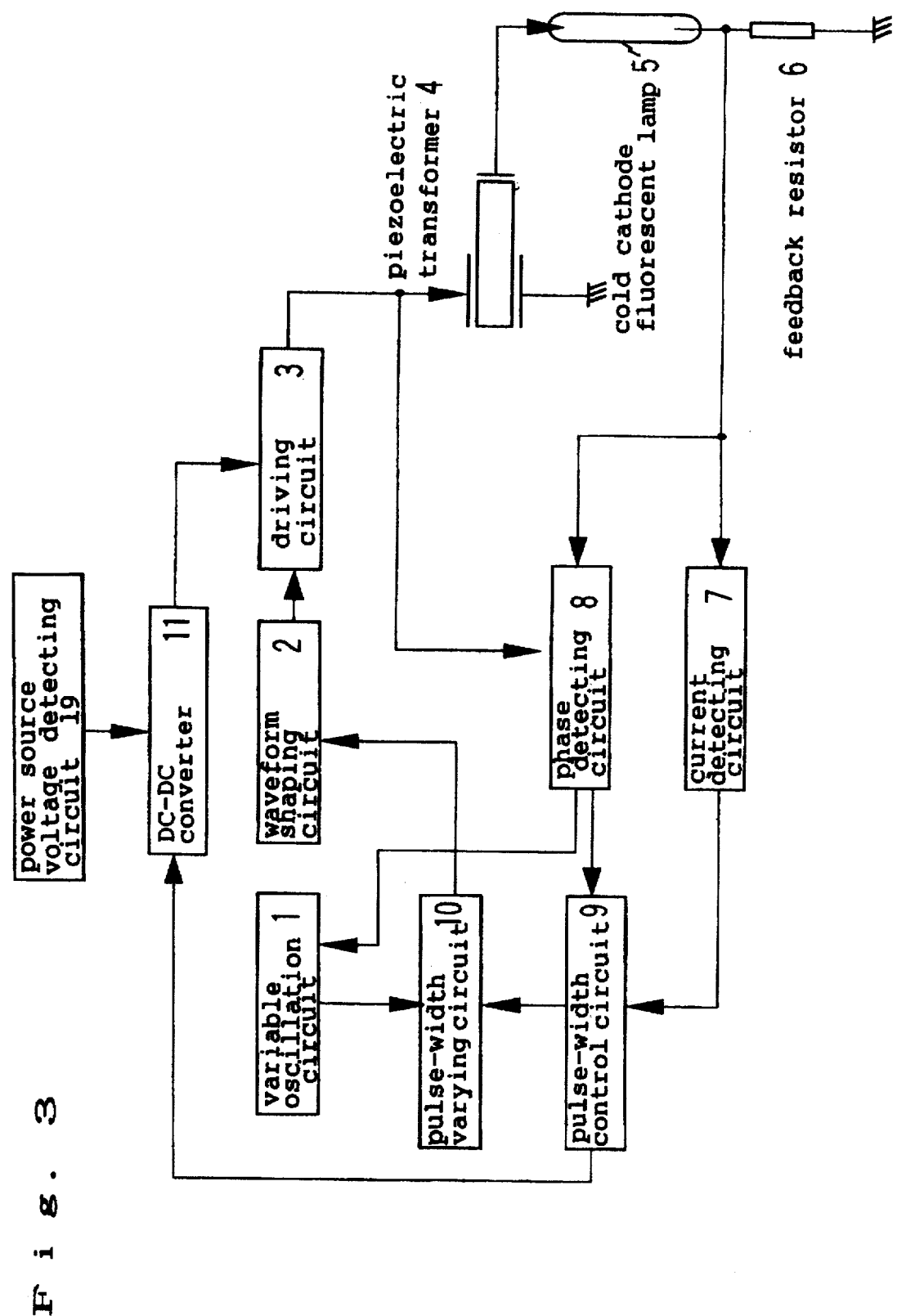
FIG. 3 is a block diagram of Embodiment 2 of the inverter power source apparatus using a piezoelectric transformer according to the invention.

FIG. 3 is a block diagram showing an inverter power source apparatus using a piezoelectric transformer which is a second embodiment of the invention. In the figure, the piezoelectric transformer 4 may be a piezoelectric transformer of any desired type, i.e., the Rosen type or another type. A variable oscillation circuit 1 generates an AC driving signal of a frequency which is in the vicinity of the resonance frequency of the piezoelectric transformer 4. The output of the variable oscillation circuit 1 is input to a pulse-width varying circuit 10 wherein the AC output signal of the variable oscillation circuit 1 is subjected to the pulse width modulation. When the piezoelectric transformer 4 is driven by a driving signal having a pulse waveform, high-frequency components other than those in the vicinity of the resonance frequency are transformed into heat in the piezoelectric transformer 4. In the view point of the reliability of the piezoelectric transformer 4 and the conversion efficiency, the high-frequency components of the output signal of the variable oscillation circuit 1 are removed away by a waveform shaping circuit 2 so that the output signal is shaped into a substantially sinusoidal wave. In a simple case, the waveform shaping circuit 2 is a low pass filter. In the case where the efficiency is especially significant, a bandpass filter is used as the waveform shaping circuit 2. The output of the waveform shaping circuit 2 is subjected by a driving circuit 3 to current amplification or voltage amplification so as to be amplified to a level sufficient for driving the piezoelectric transformer 4. The driving circuit 3 is configured by only an usual amplifying circuit consisting of transistors, or by a combination of an amplifying circuit and a step-up transformer. The driving circuit 3 is powered by an output of a DC—DC converter 11. The output of the driving circuit 3 is input to the piezoelectric transformer 4. Reference numeral 19 is a power source voltage detecting circuit. The piezoelectric transformer 4 boosts the input voltage by the piezoelectric effect. The output signal of the piezoelectric transformer is applied to a cold cathode fluorescent lamp 5 which is a load, so that the cold cathode fluorescent lamp 5 is lit.

The resonance frequency of the piezoelectric transformer 4 is varied by changes in environments such as the ambient temperature and the load, or by a temperature rise due to the driving operation. If the piezoelectric transformer 4 is driven by a constant frequency, therefore, the relationship between the resonance frequency of the piezoelectric transformer 4 and the driving frequency is varied. If the driving frequency is largely deviated from the resonance frequency of the piezoelectric transformer 4, the voltage step-up ratio of the piezoelectric transformer 4 is critically reduced. As a result, a sufficient voltage cannot be applied to the cold cathode fluorescent lamp 5 which is the load, and hence a sufficient current cannot be supplied to the fluorescent lamp, with the result that the cold cathode fluorescent lamp 5 cannot keep sufficient brightness. Therefore, the driving frequency of the piezoelectric transformer 4 must be kept not largely separated from the resonance frequency.

The circuit shown in FIG. 3 can comply with the variation in the characteristics such as the resonance frequency of the piezoelectric transformer 4. A feedback resistor 6 having a small resistance is connected in series to the cold cathode fluorescent lamp 5. The feedback resistor 6 is used for detecting the current flowing through the cold cathode fluorescent lamp 5. The voltage across the feedback resistor 6 is input to a current detecting circuit 7. The current detecting circuit 7 detects the load current flowing through the cold cathode fluorescent lamp 5, from the voltage across the feedback resistor 6, and supplies the results to a pulse-width control circuit 9. The pulse-width control circuit 9 controls the pulse width of the output signal of the variable oscillation circuit 1 via the pulse-width varying circuit 10 so that the voltage across the feedback resistor 6 is constant, i.e., the load current flowing through the cold cathode fluorescent lamp 5 is constant. When the current of the cold cathode fluorescent lamp 5 is decreased, for example, the voltage across the feedback resistor 6 is lowered. The pulse-width control circuit 9 detects that the voltage across the feedback resistor 6 becomes lower than a predetermined value, and gives the pulse-width varying circuit 10 instructions for increasing the pulse width of the driving signal. Consequently, the amplitude of the output signal of the waveform shaping circuit 2 is increased so that the input of the piezoelectric transformer 4 is increased, thereby increasing the current of the cold cathode fluorescent lamp 5. By contrast, when the current of the cold cathode fluorescent lamp 5 is increased, the voltage across the feedback resistor 6 is raised. The pulse-width control circuit 9 detects that the voltage across the feedback resistor 6 becomes higher than the predetermined value, and gives the pulse-width varying circuit 10 instructions for decreasing the pulse width of the driving signal. Consequently, the amplitude of the output signal of the waveform shaping circuit 2 is deceased so that the input of the piezoelectric transformer 4 is decreased, thereby reducing the current of the cold cathode fluorescent lamp 5. As a result of the control, the current of the cold cathode fluorescent lamp 5 becomes substantially constant and the cold cathode fluorescent lamp is lit with substantially constant brightness.

When only the control of the pulse width of the driving signal is conducted by the pulse-width varying circuit 10 in order to make substantially constant the voltage across the feedback resistor 6, i.e., the load current flowing through the cold cathode fluorescent lamp 5, however, the output voltage of the piezoelectric transformer 4 must be lowered in the case where the impedance of the cold cathode fluorescent lamp 5 decreases to a very low level. At this time, the high-frequency components of the driving signal are increased to a very high level so as to increase the loss of the piezoelectric transformer 4, whereby the driving efficiency is lowered and reliability also is significantly impaired.

Figure 4:
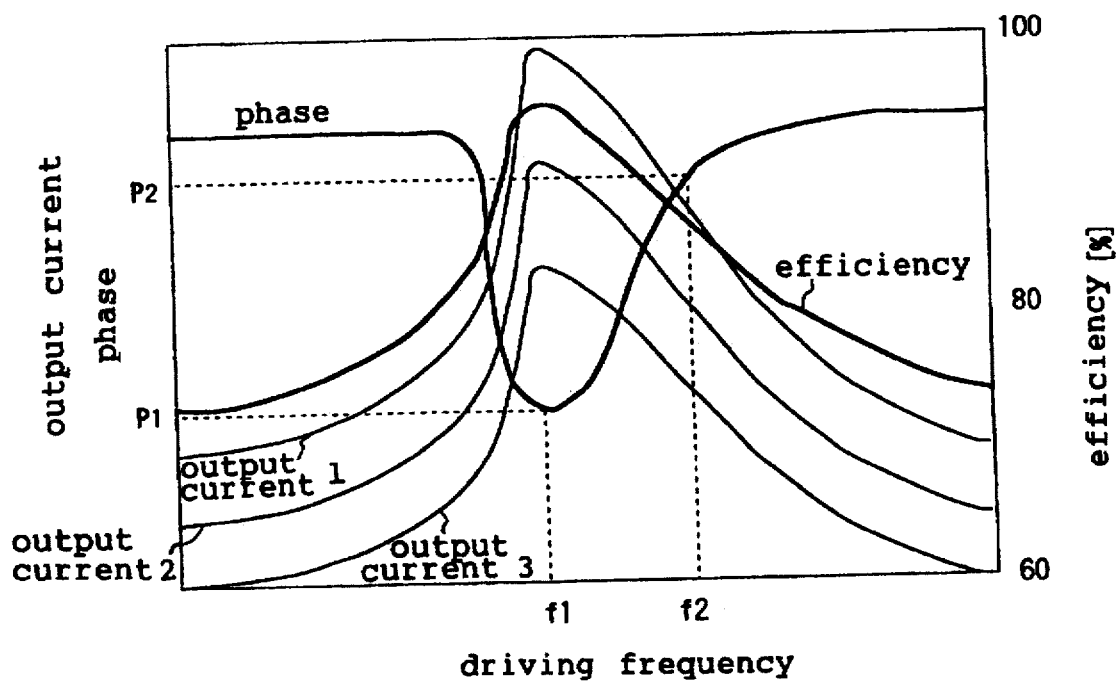
FIG. 4 is a frequency characteristic graph of an output load current, the phase difference between a voltage across a feedback resistor and an input voltage of a piezoelectric transformer, and the driving efficiency.

FIG. 4 shows frequency characteristics of the output load current, the phase difference between the voltage across the feedback resistor 6 and the input voltage of the piezoelectric transformer 4, and the driving efficiency. The operation of the circuit of FIG. 3 will be described with reference to the characteristic graph of FIG. 4. In the case where the impedance of the cold cathode fluorescent lamp 5 which is the load decreases to a very low level, for example, the output current exhibits the characteristics of the output current 1 even when the driving voltage of the piezoelectric transformer 4 is constant. In this case, the output current characteristics become excessively large. At the same time when the pulse-width control circuit 9 gives the instructions to the pulse-width varying circuit 10, therefore, instructions are issued to the DC—DC converter 11. When the pulse width seems to be excessively deceased, the DC output voltage of the DC—DC converter 11 is lowered. The lowered DC voltage is supplied as a DC power source to the driving circuit 3. As a result, the current characteristics are transferred from those of the output current 1 to those of the output current 2 so that the pulse width of the driving signal is returned to a usual one. By contrast, in the case where the impedance of the cold cathode fluorescent lamp 5 which is the load increases to a very high level, the output current exhibits the characteristics of the output current 3 even when the pulse width is increased so that the driving voltage of the piezoelectric transformer 4 is raised. Thus, it is impossible to take out a sufficient output current even when the pulse width of the driving signal is increased. At the same time when the pulse-width control circuit 9 gives the instructions to the pulse-width varying circuit 10, instructions are issued to the DC—DC converter 11. The DC—DC converter 11 raises the DC output voltage. The raised DC voltage is supplied as a DC power source to the driving circuit 3. In other words, the conversion of the DC voltage by the DC—DC converter 11 is executed when the pulse width of the driving signal is outside a certain range.

When only the controls of changing the pulse width of the driving signal and changing the DC power source are conducted, however, there is a possibility that the relationship between the driving frequency and the resonance frequency of the piezoelectric transformer 4 is not substantially constant. When the driving frequency is largely deviated from the resonance frequency of the piezoelectric transformer 4, the driving efficiency of the piezoelectric transformer 4 is significantly lowered, or the control of changing only the pulse width of the DC power source will become insufficient for supplying a sufficient current to the load. To comply with this, limitation is imposed by the phase detecting circuit 8 on the relationship between the resonance frequency of the piezoelectric transformer 4 and the driving frequency. Specifically, the driving range is previously set within a range $P_1-P_2$ with respect to the resonance frequency of the piezoelectric transformer. The phase detecting circuit 8 detects the phase difference P between the voltage across the feedback resistor 6 and the input voltage of the piezoelectric transformer 4, and sets the driving frequency via the variable oscillation circuit 1 so that the phase difference is always within the preset range $P_1-P_2$. In a period when the characteristics of FIG. 4 are attained, the range of the driving frequency is within the preset range $f_1-f_2$ corresponding to the preset range $P_1-P_2$. In order to inform whether the driving frequency is currently within the preset range or not, the detection results of the phase detecting circuit 8 are input also to the pulse-width control circuit 9. When the phase difference is within the preset range $P_1-P_2$, the above-described controls of changing the pulse width of the driving signal and changing the DC power source are conducted so that the output current is changed as the output currents 1, 2, and 3 of FIG. 4. Specifically, when the output current is decreased, the pulse-width control circuit 9 gives the pulse-width varying circuit 10 instructions for increasing the pulse width of the driving signal, or those for raising the DC output voltage of the DC—DC converter 11, so that the amplitude of the output signal of the waveform shaping circuit 2 is increased. By contrast, when the output current is increased, the pulse-width control circuit 9 gives the pulse-width varying circuit 10 instructions for decreasing the pulse width of the driving signal, or those for lowering the DC output voltage of the DC—DC converter 11, so that the amplitude of the output signal is decreased. When the phase difference is caused to be outside the preset range $P_1-P_2$, the operation of the pulse-width control circuit 9 is stopped and the driving frequency is changed via the variable oscillation circuit 1 so that the phase difference is always equal to or smaller than $P_1$. Thereafter, the pulse-width varying circuit 10 and the DC—DC converter 11 cooperate to change the input voltage of the piezoelectric transformer 4.

In the embodiment, the phase difference between the driving voltage of the piezoelectric transformer 4 and the current flowing into the cold cathode fluorescent lamp 5 which is the load is used in the detection of the resonance characteristics of the piezoelectric transformer 4. It is a matter of course that the same effects can be attained in a configuration in which the phase difference between the driving voltage of the cold cathode fluorescent lamp 5 which is the load and the current flowing into the cold cathode fluorescent lamp 5, that between the input and output voltages of the piezoelectric transformer 4, that between the input and output currents of the piezoelectric transformer 4, the inclination of the frequency characteristics of the input or output current of the piezoelectric transformer 4, or the like is used.

An inverter power source apparatus using a piezoelectric transformer can be provided in which the control range of the output current is widened by the above-described operations of controlling the pulse width of the driving signal and controlling the DC power source, so that, even when the load is changed, the apparatus can sufficiently comply with the change, and in which the driving efficiency is made high by setting the relationship between the resonance frequency of the piezoelectric transformer and the driving frequency substantially constant by the control of the driving frequency.

(Embodiment 3)

Figure 5:
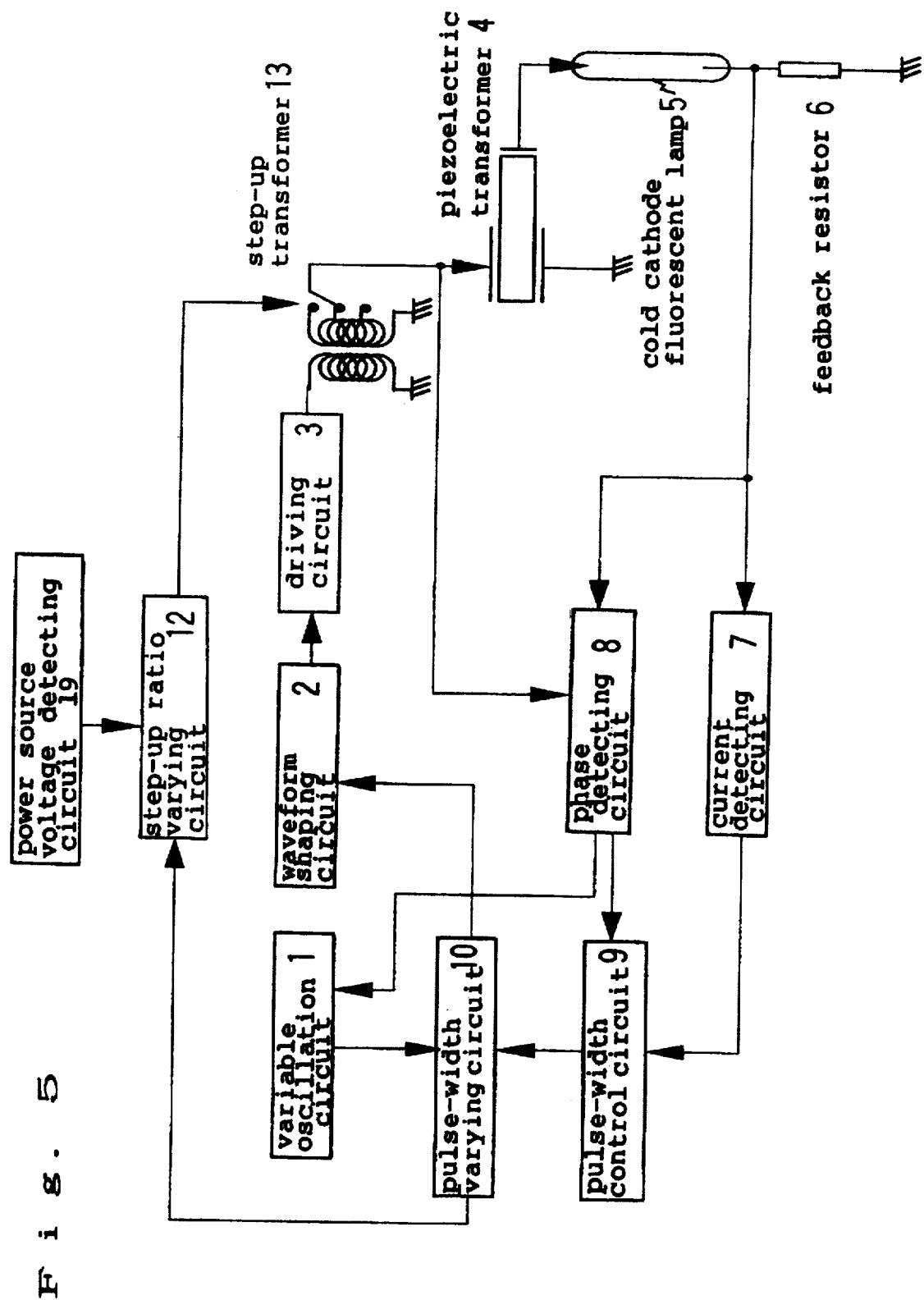
FIG. 5 is a block diagram of Embodiment 3 of the inverter power source apparatus using a piezoelectric transformer according to the invention.

FIG. 5 is a block diagram showing an inverter power source apparatus using a piezoelectric transformer which is a third embodiment of the invention. In the figure, the piezoelectric transformer 4 may be a piezoelectric transformer of any desired type, i.e., the Rosen type or another type. A variable oscillation circuit 1 generates an AC driving signal of a frequency which is in the vicinity of the resonance frequency of the piezoelectric transformer 4. The output of the variable oscillation circuit 1 is input to a pulse-width varying circuit 10 wherein the AC output signal of the variable oscillation circuit 1 is subjected to the pulse width modulation. When the piezoelectric transformer 4 is driven by a driving signal having a pulse waveform, high-frequency components other than those in the vicinity of the resonance frequency are transformed into heat in the piezoelectric transformer 4. In the view point of the reliability of the piezoelectric transformer 4 and the conversion efficiency, the high-frequency components of the output signal of the variable oscillation circuit 1 are removed away by a waveform shaping circuit 2 so that the output signal is shaped into a substantially sinusoidal wave. In a simple case, the waveform shaping circuit 2 is a low pass filter. In the case where the efficiency is especially significant, a bandpass filter is used as the waveform shaping circuit 2. The output of the waveform shaping circuit 2 is subjected by a driving circuit 3 to current amplification or voltage amplification so as to be amplified to a level sufficient for driving the piezoelectric transformer 4. The driving circuit 3 is configured by usually an amplifying circuit consisting of transistors, or by a combination of an amplifying circuit and a step-up transformer. The output of the driving circuit 3 is input to the piezoelectric transformer 4. The piezoelectric transformer 4 boosts the input voltage by the piezoelectric effect. The output signal of the piezoelectric transformer is applied to a cold cathode fluorescent lamp 5 so that the cold cathode fluorescent lamp 5 is lit.

The characteristics such as the resonance frequency of the piezoelectric transformer 4 are varied by changes in environments such as the ambient temperature and the load, or by a temperature rise due to the driving operation. If the piezoelectric transformer 4 is driven by a constant frequency, therefore, the relationship between the resonance frequency of the piezoelectric transformer 4 and the driving frequency is varied. If the driving frequency is largely deviated from the resonance frequency of the piezoelectric transformer 4, the voltage step-up ratio of the piezoelectric transformer 4 is critically reduced and a sufficient voltage cannot be supplied to the load. As a result, a sufficient current cannot be caused to flow through the cold cathode fluorescent lamp 5, and the cold cathode fluorescent lamp 5 cannot keep sufficient brightness.

The circuit shown in FIG. 5 can comply with the variation in the characteristics such as the resonance frequency of the piezoelectric transformer 4. A feedback resistor 6 having a small resistance is connected in series to the cold cathode fluorescent lamp 5. The feedback resistor 6 is used for detecting the current flowing through the cold cathode fluorescent lamp 5. The voltage across the feedback resistor 6 is input to a current detecting circuit 7. The current detecting circuit 7 detects the load current flowing through the cold cathode fluorescent lamp 5, from the voltage across the feedback resistor 6, and supplies the results to a pulse-width control circuit 9. The pulse-width control circuit 9 controls the pulse width of the output signal of the variable oscillation circuit 1 via the pulse-width varying circuit 10 so that the voltage across the feedback resistor 6 is constant, i.e., the load current flowing through the cold cathode fluorescent lamp 5 is constant. When the current of the cold cathode fluorescent lamp 5 is decreased, for example, the voltage across the feedback resistor 6 is lowered. The pulse-width control circuit 9 detects that the voltage across the feedback resistor 6 becomes lower than a predetermined value, and gives the pulse-width varying circuit 10 instructions for increasing the pulse width of the driving signal. Consequently, the amplitude of the output signal of the waveform shaping circuit 2 is increased so that the input of the piezoelectric transformer 4 is increased, thereby increasing the current of the cold cathode fluorescent lamp 5. By contrast, when the current of the cold cathode fluorescent lamp 5 is increased, the voltage across the feedback resistor 6 is raised. The pulse-width control circuit 9 detects that the voltage across the feedback resistor 6 becomes higher than the predetermined value, and gives the pulse-width varying circuit 10 instructions for decreasing the pulse width of the driving signal. Consequently, the amplitude of the output signal of the waveform shaping circuit 2 is decreased so that the input of the piezoelectric transformer 4 is decreased, thereby reducing the current of the cold cathode fluorescent lamp 5. As a result of the control, the current of the cold cathode fluorescent lamp 5 becomes substantially constant and the cold cathode fluorescent lamp is lit with substantially constant brightness.

Figure 6:
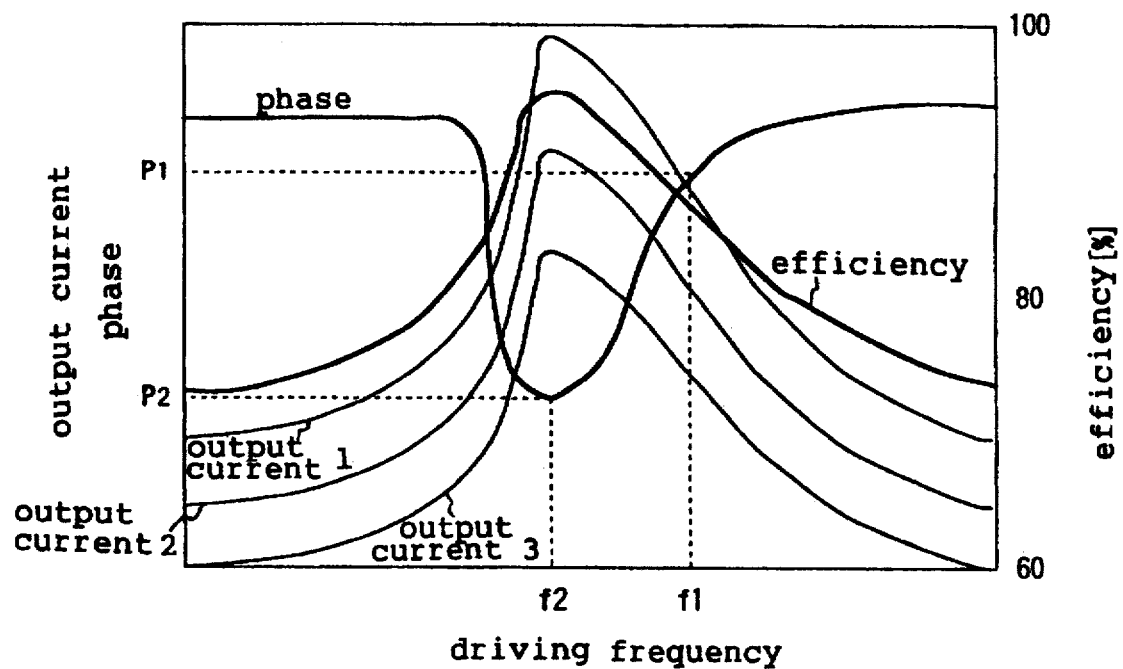
FIG. 6 is a frequency characteristic graph of an output load current, the phase difference between a voltage across a feedback resistor and an input voltage of a piezoelectric transformer, and the driving efficiency.

When only the control of changing the pulse width of the output signal of the variable oscillation circuit 1 is conducted by the pulse-width varying circuit 10 in order to make substantially constant the voltage across the feedback resistor 6, i.e., the load current flowing through the cold cathode fluorescent lamp 5, however, the pulse width of the driving signal is decreased to a very low level in the case where the impedance of the cold cathode fluorescent lamp 5 decreases to a very low level. At this time, the high-frequency components of the driving signal are increased to a very high level so as to increase the loss of the piezoelectric transformer 4, whereby the driving efficiency of the piezoelectric transformer 4 is lowered and reliability also is significantly impaired. FIG. 6 shows frequency characteristics of the output load current, the phase difference between the voltage across the feedback resistor 6 and the input voltage of the piezoelectric transformer 4, and the driving efficiency. The operation of the circuit of FIG. 5 will be described with reference to the characteristic graph of FIG. 6. In the case where the impedance of the cold cathode fluorescent lamp 5, which is the load, decreases to a very low level, for example, the output current exhibits the characteristics of the output current 1 even when the driving voltage of the piezoelectric transformer 4 is constant. In this case, the output current characteristics become excessively large. At the same time when the pulse-width control circuit 9 gives the instructions to the pulse-width varying circuit 10, therefore, the step-up ratio of a step-up transformer 13 is changed via a step-up ratio varying circuit 12. In other words, when the pulse width is too narrow, the step-up ratio of a step-up transformer 13 is lowered. Then, the current characteristics are transferred from those of the output current 1 to those of the output current 2 so that the pulse width of the driving signal is returned to a usual one. By contrast, in the case where the impedance of the cold cathode fluorescent lamp 5 which is the load increases to a very high level, the output current exhibits the characteristics of the output current 3 even when the pulse width is widened so that the driving voltage of the piezoelectric transformer 4 is raised. Thus, it is impossible to take out a sufficient output current even when the pulse width of the driving signal is widened. At the same time when the pulse-width control circuit 9 gives the instructions to the pulse-width varying circuit 10, the step-up ratio of the step-up transformer 13 is changed via the step-up ratio varying circuit 12 so that the current characteristics are transferred from those of the output current 1 to those of the output current 2, thereby returning the pulse width of the driving signal to a usual one. The raised driving voltage is supplied to the piezoelectric transformer 4. Further, 19 is a power source voltage detecting circuit.

When only the controls of changing the pulse width of the driving signal and changing the step-up ratio are conducted, however, there is a possibility that the relationship between the driving frequency and the resonance frequency of the piezoelectric transformer 4 is not substantially constant. When the driving frequency is largely deviated from the resonance frequency of the piezoelectric transformer 4, the driving efficiency of the piezoelectric transformer 4 is significantly lowered, or the control of changing only the pulse width will become insufficient for supplying a sufficient current to the load. To comply with this, in the circuit of FIG. 5, limitation is imposed by the phase detecting circuit 8 on the relationship between the resonance frequency of the piezoelectric transformer 4 and the driving frequency. Specifically, the driving range of the phase difference P between the voltage across the feedback resistor 6 and the input voltage of the piezoelectric transformer 4 is previously set within a range $P_1$–$P_2$. In a period when the characteristics of FIG. 6 are attained, the above-mentioned setting corresponds to that in which the driving frequency is set to the preset range $f_1$–$f_2$.

The operation of the circuit of FIG. 5 will be described with reference to the characteristic graph of FIG. 6. The phase detecting circuit 8 detects the phase difference P between the voltage across the feedback resistor 6 and the input voltage of the piezoelectric transformer 4, and sets the driving frequency via the variable oscillation circuit 1 so that the phase difference is always within the preset range $P_1$–$P_2$. In order to inform whether the driving frequency is currently within the preset range or not, the detection results of the phase detecting circuit 8 are input also to the pulse-width control circuit 9. When the phase difference is within the preset range $P_1$–$P_2$, the above-described controls of changing the pulse width of the driving signal and changing the step-up ratio of the step-up transformer are conducted. Specifically, when the output current is decreased, the pulse-width control circuit 9 gives the pulse-width varying circuit 10 instructions for increasing the pulse width of the driving signal, or those for raising the step-up ratio of the step-up transformer 13, so that the amplitude of the output signal of the waveform shaping circuit 2 is increased. By contrast, when the output current is increased, the pulse-width control circuit 9 gives the pulse-width varying circuit 10 instructions for decreasing the pulse width of the driving signal, or those for lowering the step-up ratio of the step-up transformer 13, so that the amplitude of the output signal is decreased. When the phase difference is caused to be outside the preset range $P_1$–$P_2$, the operation of the pulse-width control circuit 9 is stopped and the driving frequency is changed via the variable oscillation circuit 1 so that the phase difference is always within the preset range $P_1$–$P_2$. Thereafter, the pulse-width varying circuit 10 and the step-up ratio varying circuit 12 cooperate to change the input voltage of the piezoelectric transformer 4.

In the embodiment, the phase difference between the driving voltage of the piezoelectric transformer 4 and the current flowing into the cold cathode fluorescent lamp 5 which is the load is used in the detection of the resonance characteristics of the piezoelectric transformer 4. It is a matter of course that the same effects can be attained in a configuration in which the phase difference between the driving voltage of the cold cathode fluorescent lamp 5 which is the load and the current flowing into the cold cathode fluorescent lamp 5, that between the input and output voltages of the piezoelectric transformer 4, that between the input and output currents of the piezoelectric transformer 4, the inclination of the frequency characteristics of the input or output current of the piezoelectric transformer 4, or the like is used.

An inverter power source apparatus using a piezoelectric transformer can be provided in which the control range of the output current is widened by the above-described operations of controlling the pulse width of the driving signal and controlling the step-up ratio, so that, even when the load is largely changed, the apparatus can sufficiently comply with the change, and in which the driving efficiency is made high by setting the relationship between the resonance frequency of the piezoelectric transformer and the driving frequency substantially constant by the control of the driving frequency.

(Embodiment 4)

Figure 7:
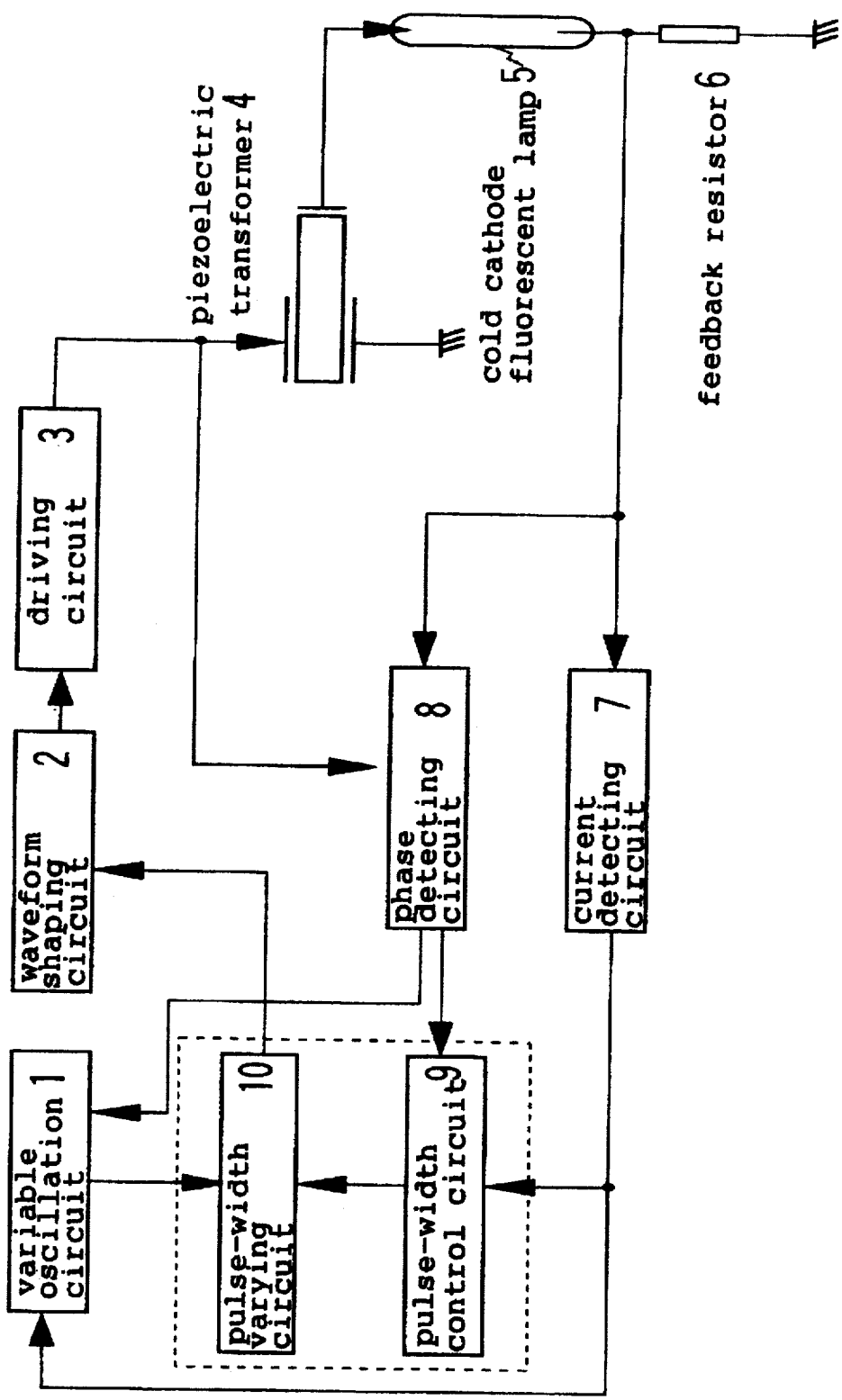
FIG. 7 is a block diagram of Embodiment 4 of the inverter power source apparatus using a piezoelectric transformer according to the invention.

FIG. 7 is a block diagram showing an inverter power source apparatus using a piezoelectric transformer which is a fourth embodiment of the invention. In the figure, the piezoelectric transformer 4 may be a piezoelectric transformer of any desired type, i.e., the Rosen type or another type. A variable oscillation circuit 1 generates an AC driving signal of a frequency which is in the vicinity of the resonance frequency of the piezoelectric transformer 4. The output of the variable oscillation circuit 1 is input to a pulse-width varying circuit 10 wherein the AC output signal of the variable oscillation circuit 1 is subjected to the pulse width modulation. When the piezoelectric transformer 4 is driven by a driving signal having a pulse waveform, high-frequency components other than those in the vicinity of the resonance frequency are transformed into heat in the piezoelectric transformer 4. In the view point of the reliability of the piezoelectric transformer 4 and the conversion efficiency, the high-frequency components of the output signal of the variable oscillation circuit 1 are removed away by a waveform shaping circuit 2 so that the output signal is shaped into a substantially sinusoidal wave. In a simple case, the waveform shaping circuit 2 is a low pass filter. In the case where the efficiency is especially significant, a bandpass filter is used as the waveform shaping circuit 2. The output of the waveform shaping circuit 2 is subjected by a driving circuit 3 to current amplification or voltage amplification so as to be amplified to a level sufficient for driving the piezoelectric transformer 4. The driving circuit 3 is configured by only a usual amplifying circuit consisting of transistors, or by a combination of an amplifying circuit and a step-up transformer. The output of the driving circuit 3 is input to the piezoelectric transformer 4. The piezoelectric transformer 4 boosts the input voltage by the piezoelectric effect. An AC high voltage which is the output signal of the piezoelectric transformer is applied to a cold cathode fluorescent lamp 5 which is a load, so that the cold cathode fluorescent lamp 5 is lit.

The characteristics such as the resonance frequency of the piezoelectric transformer 4 are varied by changes in environments such as the ambient temperature and the load, or by a temperature rise due to the driving operation. If the piezoelectric transformer 4 is driven by a constant frequency, therefore, the relationship between the resonance frequency of the piezoelectric transformer 4 and the driving frequency is varied. If the driving frequency is largely deviated from the resonance frequency of the piezoelectric transformer 4, the voltage step-up ratio of the piezoelectric transformer 4 is critically reduced. Consequently, the load cannot be supplied with a sufficient current, with the result that a sufficient current cannot be caused to flow through the cold cathode fluorescent lamp 5 which is the load, and the cold cathode fluorescent lamp 5 cannot keep sufficient brightness.

The circuit shown in FIG. 7 can comply with the variation in the resonance frequency of the piezoelectric transformer 4. A feedback resistor 6 having a small resistance is connected in series to the cold cathode fluorescent lamp 5. The feedback resistor 6 is used for detecting the current flowing through the cold cathode fluorescent lamp 5. The voltage across the feedback resistor 6 is input to a current detecting circuit 7. The current detecting circuit 7 detects the load current flowing through the cold cathode fluorescent lamp 5, from the voltage across the feedback resistor 6, and supplies the results to a pulse-width control circuit 9. The pulse-width control circuit 9 controls the pulse width of the output signal of the variable oscillation circuit 1 via the pulse-width varying circuit 10 so that the voltage across the feedback resistor 6 is constant, i.e., the load current flowing through the cold cathode fluorescent lamp 5 is constant. When the current of the cold cathode fluorescent lamp 5 is decreased, for example, the voltage across the feedback resistor 6 is lowered. The pulse-width control circuit 9 detects that the voltage across the feedback resistor 6 becomes lower than a predetermined value, and gives the pulse-width varying circuit 10 instructions for increasing the pulse width of the driving signal. Consequently, the amplitude of the output signal of the waveform shaping circuit 2 is increased so that the input of the piezoelectric transformer 4 is increased, thereby increasing the current of the cold cathode fluorescent lamp 5. By contrast, when the current of the cold cathode fluorescent lamp 5 is increased, the voltage across the feedback resistor 6 is raised. The pulse-width control circuit 9 detects that the voltage across the feedback resistor 6 becomes higher than the predetermined value, and gives the pulse-width varying circuit 10 instructions for decreasing the pulse width of the driving signal. Consequently, the amplitude of the output signal of the waveform shaping circuit 2 is decreased so that the input of the piezoelectric transformer 4 is decreased, thereby reducing the current of the cold cathode fluorescent lamp 5. As a result of the control, even when the load is varied, the current of the cold cathode fluorescent lamp 5 becomes substantially constant and the cold cathode fluorescent lamp is lit with substantially constant brightness.

When only the controls of changing the pulse width of the driving signal is conducted, however, there is a possibility that the relationship between the driving frequency and the resonance frequency of the piezoelectric transformer 4 is not substantially constant. When the driving frequency is largely deviated from the resonance frequency of the piezoelectric transformer 4, the driving efficiency of the piezoelectric transformer 4 is significantly lowered, or the control of changing only the pulse width will become insufficient for supplying a sufficient current to the load. To comply with this, in the circuit of FIG. 7, limitation is imposed by the phase detecting circuit 8 on the relationship between the resonance frequency of the piezoelectric transformer 4 and the driving frequency, and the output of the current detecting circuit 7 is input also to the variable oscillation circuit 1, thereby imposing limitation on the relationship between the resonance frequency of the piezoelectric transformer 4 and the driving frequency and changing the driving frequency in a limited range.

Figure 8:
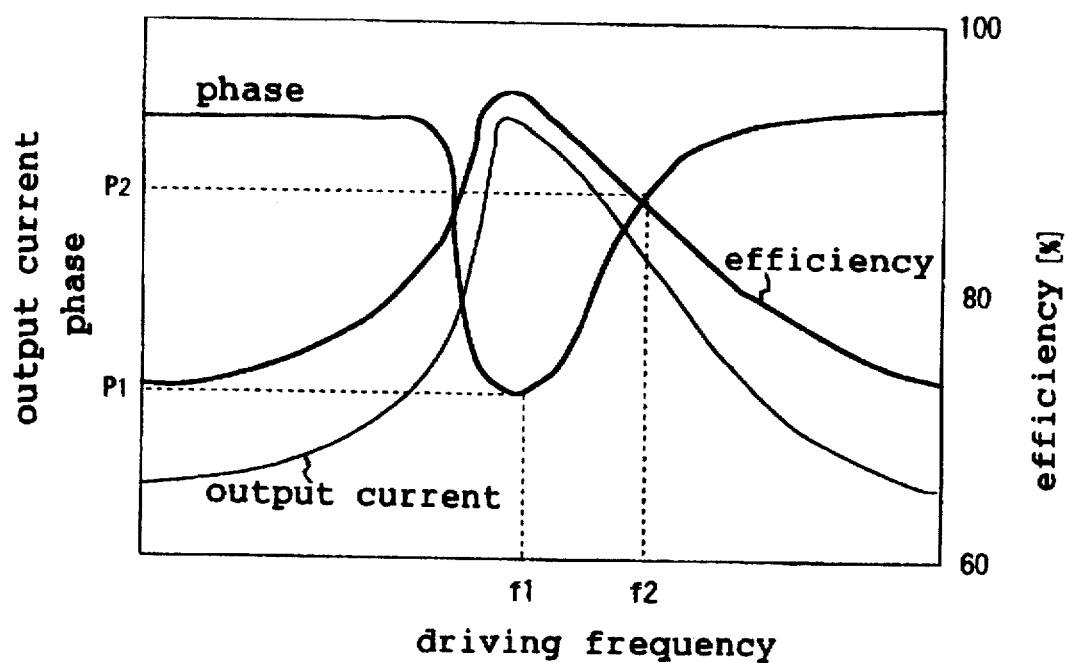
FIG. 8 is a frequency characteristic graph of an output load current, the phase difference between a voltage across a feedback resistor and an input voltage of a piezoelectric transformer, and the driving efficiency.
Figure 9:
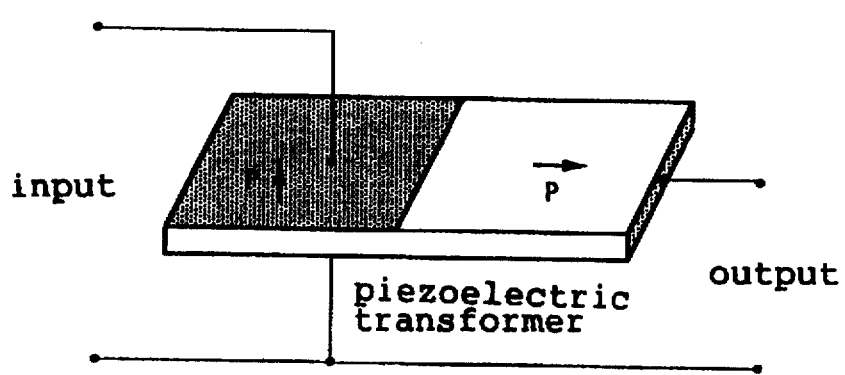
FIG. 9 is a diagram showing the configuration of a conventional Rosen-type piezoelectric transformer.
Figure 10:
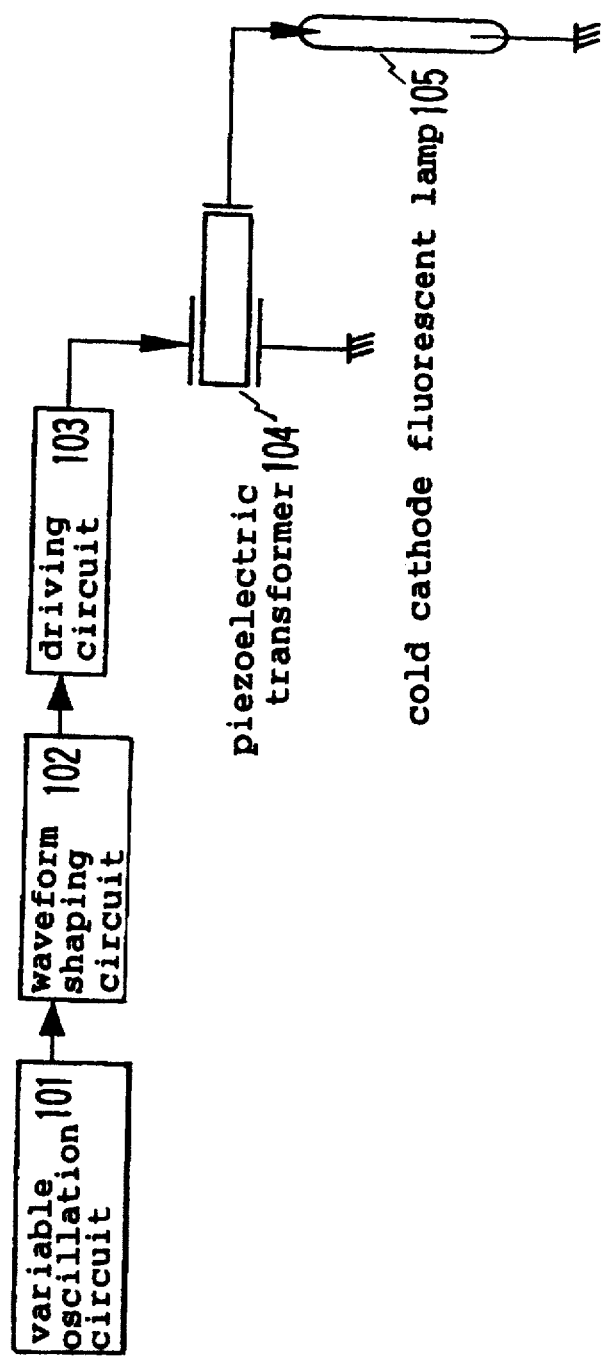
FIG. 10 is a block diagram of a prior art inverter power source apparatus using a piezoelectric transformer.
Figure 11:
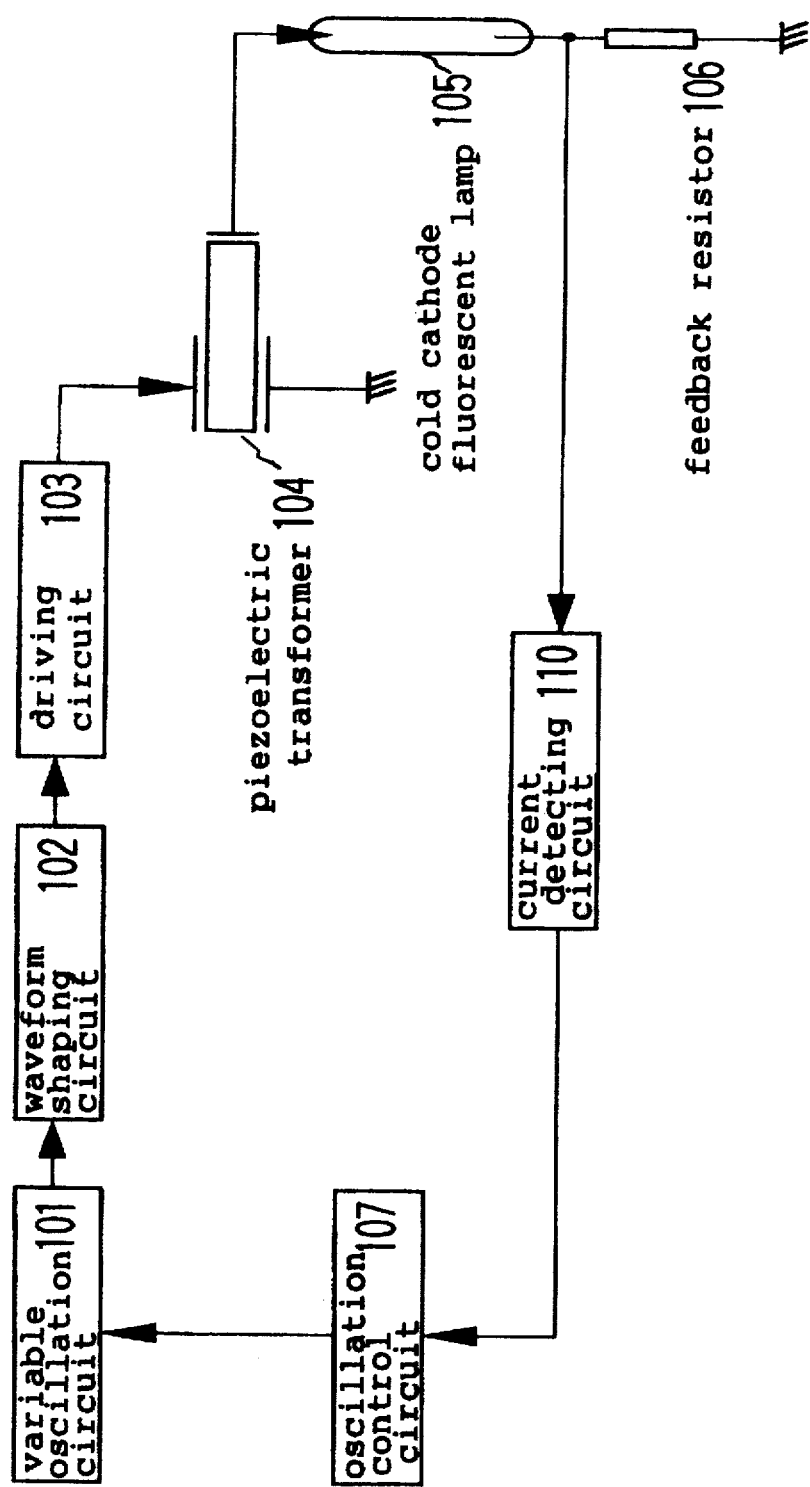
FIG. 11 is a block diagram of another prior art inverter power source apparatus using a piezoelectric transformer.
Figure 12:
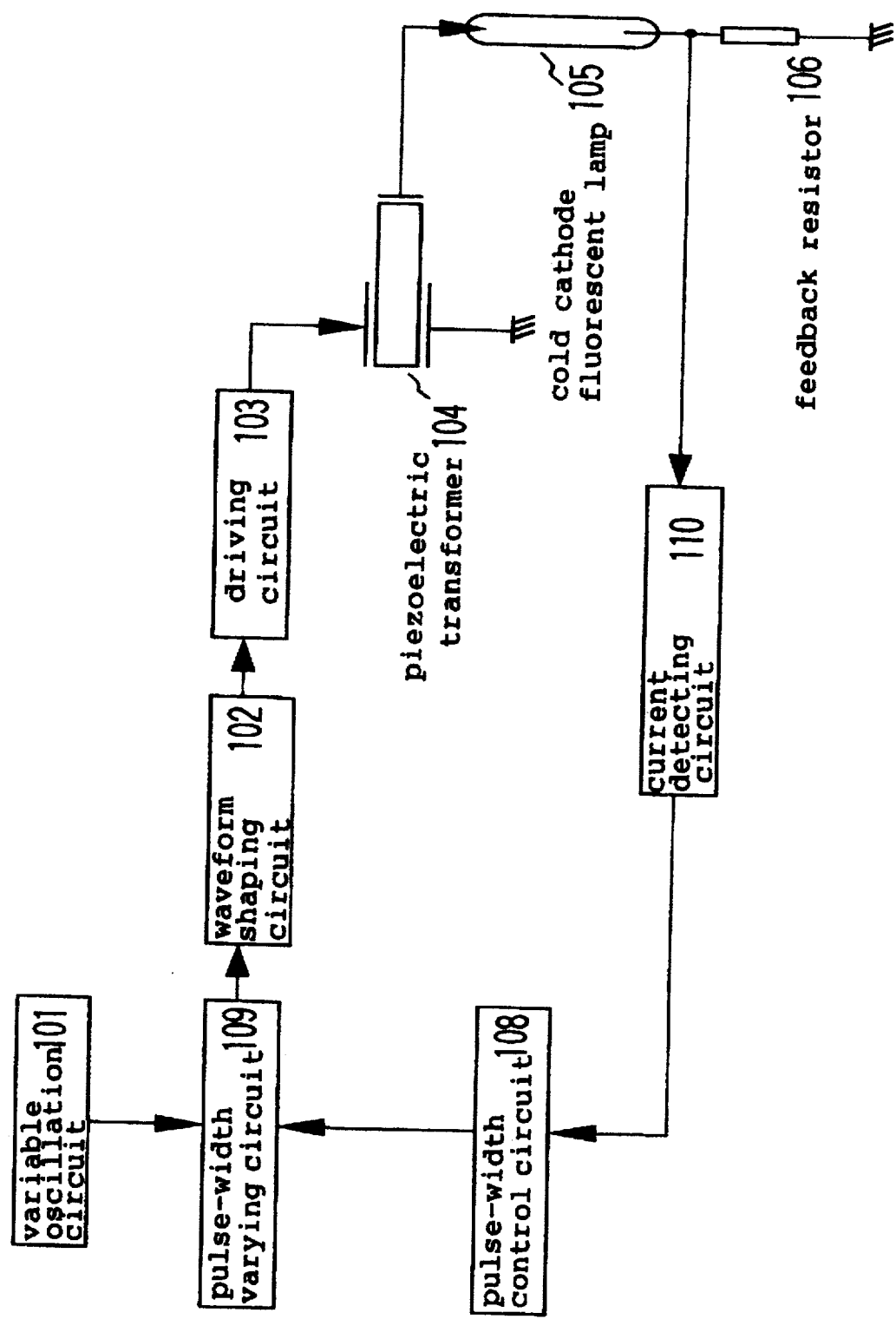
FIG. 12 is a block diagram of another prior art inverter power source apparatus using a piezoelectric transformer.

FIG. 8 shows frequency characteristics of the output current of the piezoelectric transformer 4 which enters the load, the phase difference between the voltage across the feedback resistor 6 and the input voltage of the piezoelectric transformer 4, and the driving efficiency. The operations of limiting the driving frequency and changing the driving frequency in the circuit of FIG. 7 will be described with reference to the characteristic graph of FIG. 8. Before the fluorescent lamp is driven, a range $P_1-P_2$ of the phase difference is previously determined. When the circuit of FIG. 1 start to operate, the variable oscillation circuit 1 generates the AC driving signal of a frequency which is in the vicinity of and higher than the resonance frequency of the piezoelectric transformer 4. The phase detecting circuit 8 detects the phase difference P between the voltage across the feedback resistor 6 and the input voltage of the piezoelectric transformer 4, and sets the driving frequency via the variable oscillation circuit 1 so that the phase difference is always equal to or smaller than $P_1$. In an initial stage, the operation frequency is sufficiently higher than the resonance frequency, and hence the phase difference is not smaller than $P_1$ so that the driving frequency is lowered until the phase difference is lowered so as not to be larger than $P_1$. In order to inform whether the driving frequency is currently within the preset range or not, the detection results of the phase detecting circuit 8 are input also to the pulse-width control circuit 9.

When the phase difference is within the preset range $P_1-P_2$, the control of changing the pulse width of the driving signal is enabled. Specifically, when the phase difference is within the preset range $P_1-P_2$ and the output current is decreased, the pulse-width control circuit 9 gives the pulse-width varying circuit 10 instructions for increasing the pulse width of the driving signal, so that the amplitude of the output signal of the waveform shaping circuit 2 is increased. When the phase difference is within the preset range $P_1-P_2$ and, even in the case where the pulse width of the driving signal is increased, the output current remains smaller than a predetermined value, the driving frequency is lowered within a preset frequency range $f_1-f_2$ corresponding to the phase-difference range $P_1-P_2$ so that the output voltage is raised, thereby increasing the output current. By contrast, when the load current is increased, the pulse-width control circuit 9 gives the pulse-width varying circuit 10 instructions for decreasing the pulse width of the driving signal, so that the amplitude of the output signal is decreased. When the phase difference is within the preset range $P_1-P_2$ and, even in the case where the pulse width of the driving signal is decreased, the output current remains larger than the predetermined value, the driving frequency is raised within the preset frequency range $f_1-f_2$ corresponding to the phase-difference range $P_1-P_2$, thereby decreasing the output current. When the phase difference is caused by any reason to be equal to or larger than $P_1$, the operation of the pulse-width control circuit 9 is stopped and the driving frequency is changed via the variable oscillation circuit 1 so that the phase difference is always equal to or smaller than $P_1$, with the result that the input of the piezoelectric transformer 4 is changed by the pulse-width varying circuit 10.

In the embodiment, the phase difference between the driving voltage of the piezoelectric transformer 4 and the current flowing into the cold cathode fluorescent lamp 5 which is the load is used in the detection of the resonance characteristics of the piezoelectric transformer 4. It is a matter of course that the same effects can be attained in a configuration in which the phase difference between the driving voltage of the cold cathode fluorescent lamp 5 which is the load and the current flowing into the cold cathode fluorescent lamp 5, that between the input and output voltages of the piezoelectric transformer 4, that between the input and output currents of the piezoelectric transformer 41 the frequency characteristics of the input or output current of the piezoelectric transformer 4, or the like is used.

An inverter power source apparatus using a piezoelectric transformer can be provided in which the control range of the output current is widened by the above-described operations of changing the pulse width of the driving signal and changing the driving frequency while limiting the variable frequency range of the driving signal, so that, even when the load is largely changed, the apparatus can sufficiently comply with the change, and in which the driving efficiency is made high by setting the driving frequency within the preset range which is determined on the basis from the resonance characteristics of the piezoelectric transformer.

What is claimed is:

1. An inverter power source apparatus using a piezoelectric transformer, comprising:

variable oscillating means for oscillating a pulse signal which starts at a frequency which is higher than a preset frequency range above a resonance frequency of a piezoelectric transformer, pulse-width changing means for changing a width of said pulse signal of said variable oscillating means;

driving means for generating a driving signal on the basis of an output of said pulse-width changing means;

said piezoelectric transformer which is driven by said driving signal, drives a predetermined load, and has input and output electrodes;

detecting means for detecting a relationship between said driving signal and a resonance frequency of said piezoelectric transformer, and for, on the basis of a result of the detection, controlling a frequency of said oscillation signal of said variable oscillating means so that a difference between said resonance frequency and a frequency of said driving signal is substantially within said preset frequency range; and pulse-width controlling means for, when a detection results of said detecting means shows that said difference between said resonance frequency and said frequency of said driving signal is substantially within said preset frequency range, controlling said pulse-width changing means so that a current flowing through said load is substantially constant.

2. An inverter power source apparatus using a piezoelectric transformer according to claim 1, wherein said detecting means comprises a circuit which detects one of:

a phase difference between said driving signal of said piezoelectric transformer and a current flowing into said load;

a phase difference between a voltage applied to said load and the current flowing into said load;

a phase difference between input and output voltages of said piezoelectric transformer;

a phase difference between input and output currents of said piezoelectric transformer; and inclination of frequency characteristics of the input or output current of said piezoelectric transformer.

3. A liquid crystal display apparatus wherein said apparatus uses as a power source an inverter power source apparatus using a piezoelectric transformer according to claim 1, said load is a fluorescent lamp, and said fluorescent lamp is used as a back light.

4. An inverter power source apparatus using a piezoelectric transformer, comprising:

variable oscillating means for oscillating a pulse signal which starts at a frequency which is higher than a preset frequency range above a resonance frequency of a piezoelectric transformer;

pulse-width changing means for changing a width of said pulse signal of said variable oscillating means;

driving means for amplifying a power of an output signal of said pulse-width changing means, thereby generating a driving signal;

said piezoelectric transformer which is driven by said driving signal, drives a predetermined load, and has input and output electrodes;

detecting means for detecting a relationship between said driving signal and a resonance frequency of said piezoelectric transformer, and for, on the basis of a result of the detection, controlling a frequency of said oscillation signal of said variable oscillating means so that a difference between said resonance frequency and a frequency of said driving signal is substantially with said preset frequency range;

pulse-width controlling means for, when a detection results of said detecting means shows that said difference between said resonance frequency and said frequency of said driving signal is substantially within said preset frequency range, controlling said pulse-width changing means so that a current flowing through said load is substantially constant; and a DC—DC converter which changes a voltage of a direct-current power source of said driving means on the basis of a pulse width in said pulse-width changing means or on the basis of a power source voltage.

5. An inverter power source apparatus using a piezoelectric transformer according to claim 4, wherein said detecting means comprises a circuit which detects one of:

a phase difference between said driving signal of said piezoelectric transformer and a current flowing into said load;

a phase difference between a voltage applied to said load and the current flowing into said load;

a phase difference between input and output voltages of said piezoelectric transformer;

a phase difference between input and output currents of said piezoelectric transformer; and inclination of frequency characteristics of the input or output current of said piezoelectric transformer.

6. A liquid crystal display apparatus wherein said apparatus uses as a power source an inverter power source apparatus using a piezoelectric transformer according to claim 4, said load is a fluorescent lamp, and said fluorescent lamp is used as a back light.

7. An inverter power source apparatus using a piezoelectric transformer, comprising:

variable oscillating means for oscillating a pulse signal;

pulse-width changing means for changing a width of said pulse signal of said variable oscillating means;

driving means for amplifying a power of an output signal of said pulse-width changing means, thereby generating a driving signal;

a step-up transformer in which a step-up ratio of boosting said driving signal is changeable;

a piezoelectric transformer which is driven by an output of said step-up transformer, drives a predetermined load, and has input and output electrodes;

detecting means for detecting a relationship between said driving signal and a resonance frequency of said piezoelectric transformer, and for, on the basis of a result of the detection, controlling a frequency of said oscillation signal of said variable oscillating means so that a difference between said resonance frequency and a frequency of said driving signal is substantially within a preset range;

pulse-width controlling means for, when a detection results of said detecting means shows that said difference between said resonance frequency and said frequency of said driving signal is substantially within said preset range, controlling said pulse-width changing means so that a current flowing through said load is substantially constant; and step-up ratio changing means for changing said step-up ratio of said step-up transformer on the basis of a pulse width in said pulse-width changing means or on the basis of a power source voltage.

8. An inverter power source apparatus using a piezoelectric transformer according to claim 7, wherein said detecting means comprises a circuit which detects one of:

a phase difference between said driving signal of said piezoelectric transformer and a current flowing into said load;

a phase difference between a voltage applied to said load and the current flowing into said load;

a phase difference between input and output voltages of said piezoelectric transformer;

a phase difference between input and output currents of said piezoelectric transformer; and inclination of frequency characteristics of the input or output current of said piezoelectric transformer.

9. A liquid crystal display apparatus wherein said apparatus uses as a power source an inverter power source apparatus using a piezoelectric transformer according to claim 7, said load is a fluorescent lamp, and said fluorescent lamp is used as a back light.

10. An inverter power source apparatus using a piezoelectric transformer, comprising:

variable oscillating means for oscillating a pulse signal which starts at a frequency which is higher than a preset frequency range above a resonance frequency of a piezoelectric transformer;

pulse-width changing means for changing a width of said pulse signal of said variable oscillating means;

driving means for generating a driving signal on the basis of an output of said pulse-width changing means;

said piezoelectric transformer which is driven by said driving signal, drives a predetermined load, and has input and output electrodes;

detecting means for detecting a relationship between said driving signal and a resonance frequency of said piezoelectric transformer, and for, on the basis of a result of the detection, controlling a frequency of said oscillation signal of said variable oscillating means so that a difference between said resonance frequency and a frequency of said driving signal is substantially within said preset frequency range; and pulse width controlling means for controlling said pulse-width changing means, wherein said variable oscillating means stops the lowering operation of frequency of the pulse signal when a frequency of the driving signal becomes within said preset frequency range, at the start operation, and said pulse-width controlling means do not operate at the start operation and when a detection results of said detecting means shows that said difference between said resonance frequency and said frequency of said driving signal is substantially within said preset frequency range, controls said pulse-width changing means so that a current flowing through said load is substantially constant.

11. An inverter power source apparatus using a piezoelectric transformer according to any one of claim 10, wherein said detecting means comprises a circuit which detects one of:

a phase difference between said driving signal of said piezoelectric transformer and a current flowing into said load;

a phase difference between a voltage applied to said load and the current flowing into said load;

a phase difference between input and output voltages of said piezoelectric transformer;

a phase difference between input and output currents of said piezoelectric transformer; and inclination of frequency characteristics of the input or output current of said piezoelectric transformer.

12. A liquid crystal display apparatus wherein said apparatus uses as a power source an inverter power source apparatus using a piezoelectric transformer according to claim 10, said load is a fluorescent lamp, and said fluorescent lamp is used as a back light.

* * * * *